(12) United States Patent
Mirov (10) Patent No.: US 8,855,671 B1
(45) Date of Patent: Oct. 7, 2014

(54) SYSTEM AND METHOD FOR DETERMINING POSITION

(75) Inventor: Russell Mirov, Los Altos, CA (US)

(73) Assignee: Google Inc., Mountain View, CA (US)

( * ) Notice: Subject to any disclaimer, the term of this patent is extended or adjusted under 35 U.S.C. 154(b) by 304 days.

(21) Appl. No.: 13/431,247

(22) Filed: Mar. 27, 2012

Related U.S. Application Data (60) Provisional application No. 61/468,364, filed on Mar. 28, 2011.

(51) Int. Cl.
*H04M 11/04* (2006.01)
*H04W 64/00* (2009.01)
*G01R 7/18* (2006.01)

(52) U.S. Cl.
CPC . *H04W 64/00* (2013.01); *G01R 7/18* (2013.01)
USPC ..................... 455/456.1; 455/404.2

(58) Field of Classification Search
CPC .... H04W 4/023; H04W 64/00; H04B 17/007; H04B 5/00; H04B 5/0043; G01R 7/18
USPC ............. 342/458, 47; 340/511, 572.4, 686.6; 455/404.2, 456; 370/338
See application file for complete search history.

(56) References Cited

U.S. PATENT DOCUMENTS

| | | | | |
|---|---|---|---|---|
| 6,686,881 B1* | 2/2004 | Lu et al. | ......................... | 342/458 |
| 7,395,966 B2* | 7/2008 | Braiman | ......................... | 235/454 |
| 7,463,907 B2* | 12/2008 | Smith et al. | .................. | 455/562.1 |
| 8,359,344 B2* | 1/2013 | Das et al. | ....................... | 707/706 |
| 8,593,282 B2* | 11/2013 | Scarola et al. | .............. | 340/572.1 |
| 8,600,341 B2* | 12/2013 | Johnson | ..................... | 455/404.2 |
| 2005/0153713 A1* | 7/2005 | Sharony | ..................... | 455/456.5 |
| 2009/0196267 A1* | 8/2009 | Walker, Sr. | ................... | 370/338 |
| 2011/0300850 A1* | 12/2011 | Kuo et al. | .................. | 455/422.1 |
| 2013/0099927 A1* | 4/2013 | Kulinets et al. | ............ | 340/572.1 |

* cited by examiner

*Primary Examiner* — Nizar Sivji
(74) *Attorney, Agent, or Firm* — Dority & Manning, P.A.

(57) ABSTRACT

Systems and methods for determining a position of a mobile device including a magnetic signal source deployed at a predetermined location. The magnetic signal source is adapted to transmit a low frequency modulated magnetic signal. The position and orientation of the mobile device relative to the predetermined location of the magnetic signal source is determined based on the signal bearing and the signal strength.

12 Claims, 8 Drawing Sheets

SYSTEM AND METHOD FOR DETERMINING POSITION

CROSS-REFERENCE TO RELATED APPLICATION

This application claims the benefit of U.S. Provisional Application No. 61/468,364, filed Mar. 28, 2011, which is incorporated by reference herein in its entirety.

BACKGROUND

1. Field

Embodiments relate generally to the field of positioning and location based information systems.

2. Background

Typical location based information systems depend on global positioning systems (GPS) to determine a geographic location and a remote database that contains information associated with a particular geographic location. However, GPS receivers generally rely on navigation signals broadcasted by satellites orbiting the Earth. Therefore, such receivers require an unobstructed line of sight to the satellites to provide reliable location information. Thus, GPS is typically used to establish locations in outdoor environments only and may not be suitable to indoor locations. However, indoor positioning systems (IPS) have been developed for use within indoor environments, such as office buildings. Such systems generally use various wireless transmissions, for example, infrared (IR) or ultrasound signals, for location and tracking purposes.

However, many existing solutions for indoor positioning are focused on locating or tracking a device, rather than providing ways for the device to determine its own position. Further, many existing solutions fail to provide accurate position determinations due to the inherent interference limitations that occur within indoor spaces, and fail to provide any device orientation determinations. Further still, many existing solutions require significant power consumption on the part of the mobile device. For example, a system may require the mobile device to enable its GPS function or continually transmit a signal in order to determine its position.

BRIEF SUMMARY

Embodiments relate to methods and systems for determining a position of a mobile device. By providing a unique signal source, the mobile device, and its user, may determine its position, rather than be simply located or tracked. Some embodiments utilize an indoor low frequency magnetic signal source to provide a user the ability to determine its position and/or orientation, relative to the source and absolute, despite being indoors.

In an embodiment, a method for determining position includes receiving, at a mobile device, a magnetic signal having a signal bearing and a signal strength. The signal is transmitted from an magnetic signal source having a predetermined location. The method further includes determining a position of the mobile device relative to the predetermined location based on the signal bearing and signal strength. In some embodiments, the signal source is an indoor signal source.

In another embodiment, a method for determining position includes receiving, at a mobile device, an indoor magnetic signal having a unique modulation frequency. The signal includes a signal bearing and a signal strength. The magnetic signal is transmitted from a signal source deployed at a predetermined location. The method further includes determining an absolute position and an absolute orientation of the mobile device.

In yet another embodiment, a system for determining position includes a mobile device that includes a receiver configured to receive a low-frequency magnetic signal transmitted from an magnetic signal source deployed at a predetermined location. The frequency can be unique to the source. In some embodiments, the signal source is an indoor signal source.

In an embodiment, a method for determining a position of a mobile device, includes determining, with the mobile device, a reference position based on reference information; identifying at least one proximate indoor magnetic signal source based on the reference position, wherein the proximate magnetic signal source has a unique modulation parameter; receiving, at the mobile device, the magnetic signal having a signal bearing and a signal strength; and determining the position of the mobile device relative to the predetermined location based on the signal bearing and signal strength.

In another embodiment, a method for providing a position of a mobile device includes receiving, at a reference server, a request from the mobile device for proximate indoor magnetic signal source information, wherein the request includes reference location information; and sending to the mobile device a unique identifier of a proximate indoor magnetic signal source based on the reference location information. The mobile device is adapted to identify a proximate indoor magnetic signal source based on the unique identifier and receive a magnetic signal from the source and determine the position of the mobile device relative to the source.

In yet another embodiment, a system for determining a position of a mobile device includes an indoor magnetic signal source for transmitting a low-frequency modulated magnetic signal; a reference server for storing a unique identifier of the indoor magnetic signal source; and a mobile device in communication with the reference server for receiving the unique identifier, the mobile device adapted to receive a magnetic signal from the source and determine the position of the mobile device relative to the source.

Embodiments may be implemented using hardware, firmware, software, or a combination thereof and may be implemented in one or more computer systems or other processing systems.

Further embodiments, features, and advantages of the present invention, as well as the structure and operation of the various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the information contained herein.

BRIEF DESCRIPTION OF THE DRAWINGS/FIGURES

Embodiments of the invention will now be described, by way of example only, with reference to the accompanying drawings in which corresponding reference symbols indicate corresponding parts. Further, the accompanying drawings, which are incorporated herein and form part of the specification, illustrate the embodiments of the present invention and, together with the description, further serve to explain the principles of the invention and to enable a person skilled in the relevant art(s) to make and use the invention.

The features of various embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

Embodiments relate to indoor positioning systems and methods. While illustrative embodiments are described herein with reference to particular applications, it should be understood that embodiments are not limited thereto. Other embodiments are possible, and modifications can be made to the embodiments within the spirit and scope of the teachings herein and additional fields in which the embodiments would be of significant utility. Further, when a particular feature, structure, or characteristic is described in connection with an embodiment, it is submitted that it is within the knowledge of one skilled in the relevant art to affect such feature, structure, or characteristic in connection with other embodiments whether or not explicitly described.

It would also be apparent to one of skill in the relevant art that the embodiments, as described herein, can be implemented in many different embodiments of software, hardware, firmware, and/or the entities illustrated in the figures. Any actual software code with the specialized control of hardware to implement embodiments is not limiting of the detailed description. Thus, the operational behavior of embodiments will be described with the understanding that modifications and variations of the embodiments are possible, given the level of detail presented herein.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

I. System

An indoor positioning system 100 may be implemented in an interior space 105 to determine the position of a mobile device. As shown, for example, in FIG. 1, system 100 can include a user 110, a mobile communication device 120, an indoor signal source 130, and a reference server 140. The system may further include objects of interest 150, 152 and 154, and a doorway 160. The system can be adapted to transmit a signal having a signal bearing and strength that may be received at the mobile device and used to determine the position of the mobile device, including its position and orientation relative to the signal source 130 and/or its absolute position and orientation within the interior space 105. The user 110 may use the position and/or orientation information for navigation, safety, information, recreation, or any other applications in which exact position information may be useful.

Indoor signal source 130 can be disposed at a predetermined location and adapted to transmit a signal that is unique to the area proximate the source. In an embodiment, signal source 130 is a magnetic signal source and is adapted to transmit a low frequency magnetic signal (or field) which may serve as an artificial reference point for position determination. In some embodiments, as shown, for example, in FIG. 2, multiple indoor signal sources 130 may be used. Because in some embodiments indoor signal source 130 transmits a low frequency magnetic signal, the signal may be particularly accurate and effective indoors, such as within interior space 105. The magnetic signal generated by signal source 130 may be less influenced by physical obstructions, such as, for example, walls, doors, and floors, or by static or dynamic fields that may be generated by, for example, metallic structures contained within the interior space.

Figure 1:
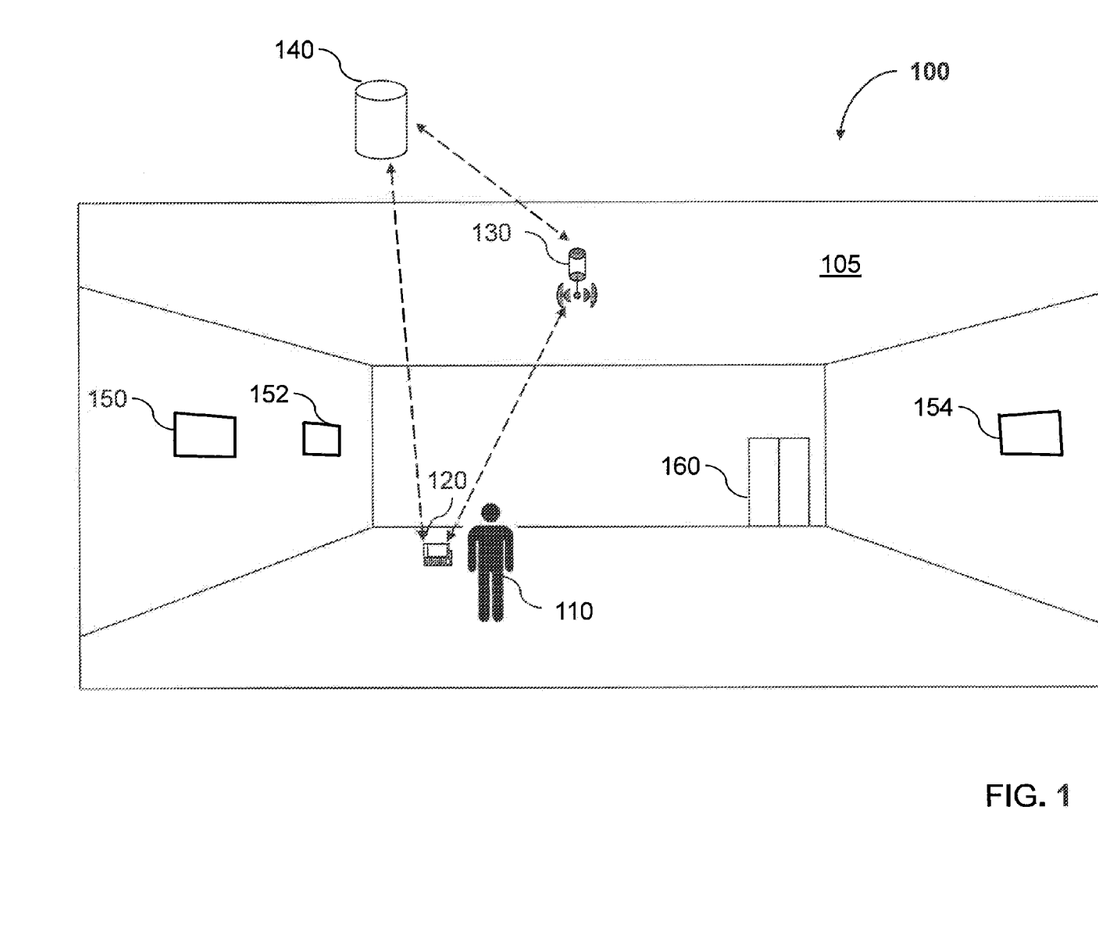
FIG. 1 is a diagram of an exemplary placement of an indoor signal source according to an embodiment of the present invention.
Figure 2:
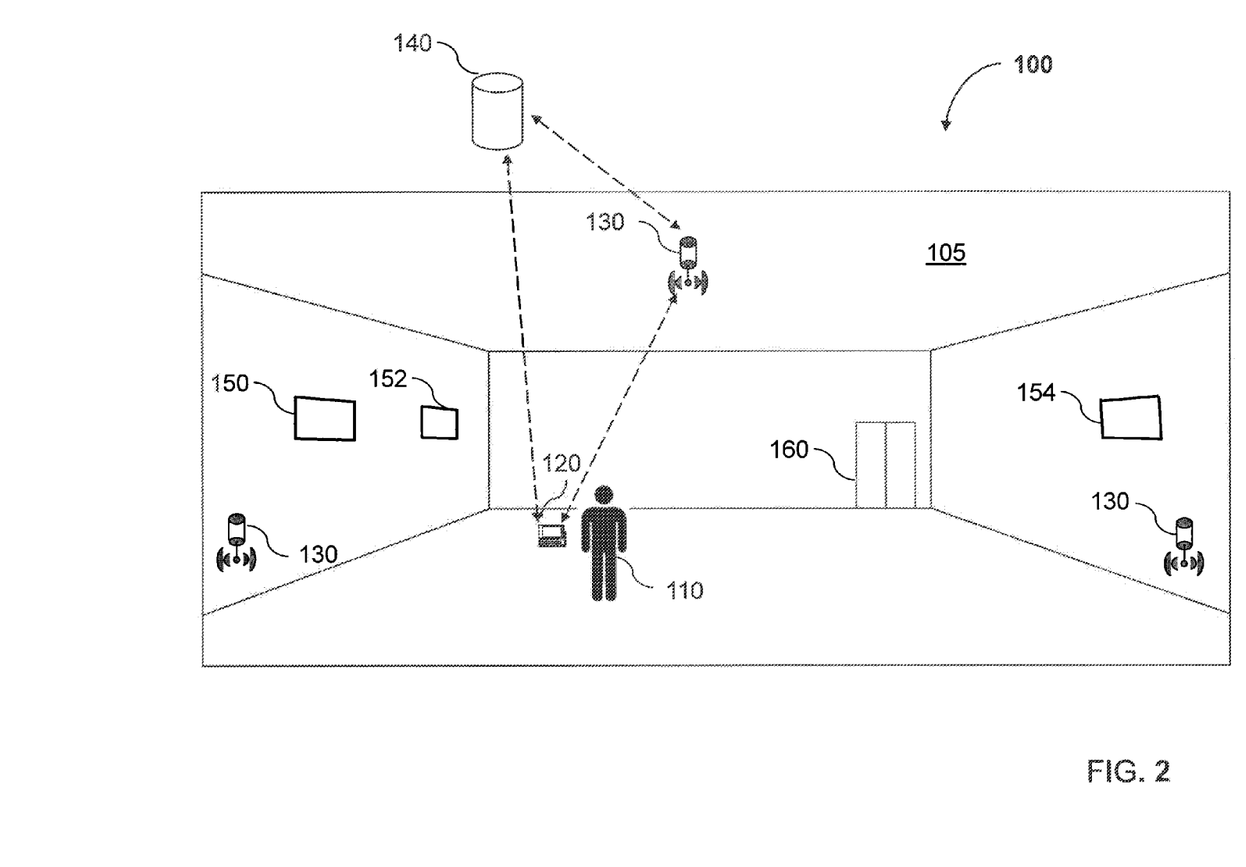
FIG. 2 is a diagram of an exemplary placement of multiple indoor signal sources according to an embodiment of the present invention.

In one embodiment, interior space 105 may comprise the interior of a building, including, but not limited to, a mall or other retail location, a stadium, an office, or any other structure in which a user 110 may be found and may desire position information. Within interior space 105, signal source 130 may be placed at any position adapted for transmitting the signal within all or a portion of the interior space. For example, signal source 130 may be located on a ceiling, a wall, or in the floor, and may be positioned in any suitable orientation. In one embodiment, signal source 130 may be centrally located within a room, a hallway, or the entire building. When multiple signal sources 130 are deployed, they may be spatially dispersed within a room, a hallway, or the entire building. Although FIGS. 1 and 2 illustrate an indoor space, it is contemplated that signal sources 130 can be located outdoors, for example, at a sports stadium, on a roof of a building, in outdoor areas surrounded by GPS-signal-obstructing objects, or at any other outdoor areas where location information may be desired, in some embodiments.

Figure 3:
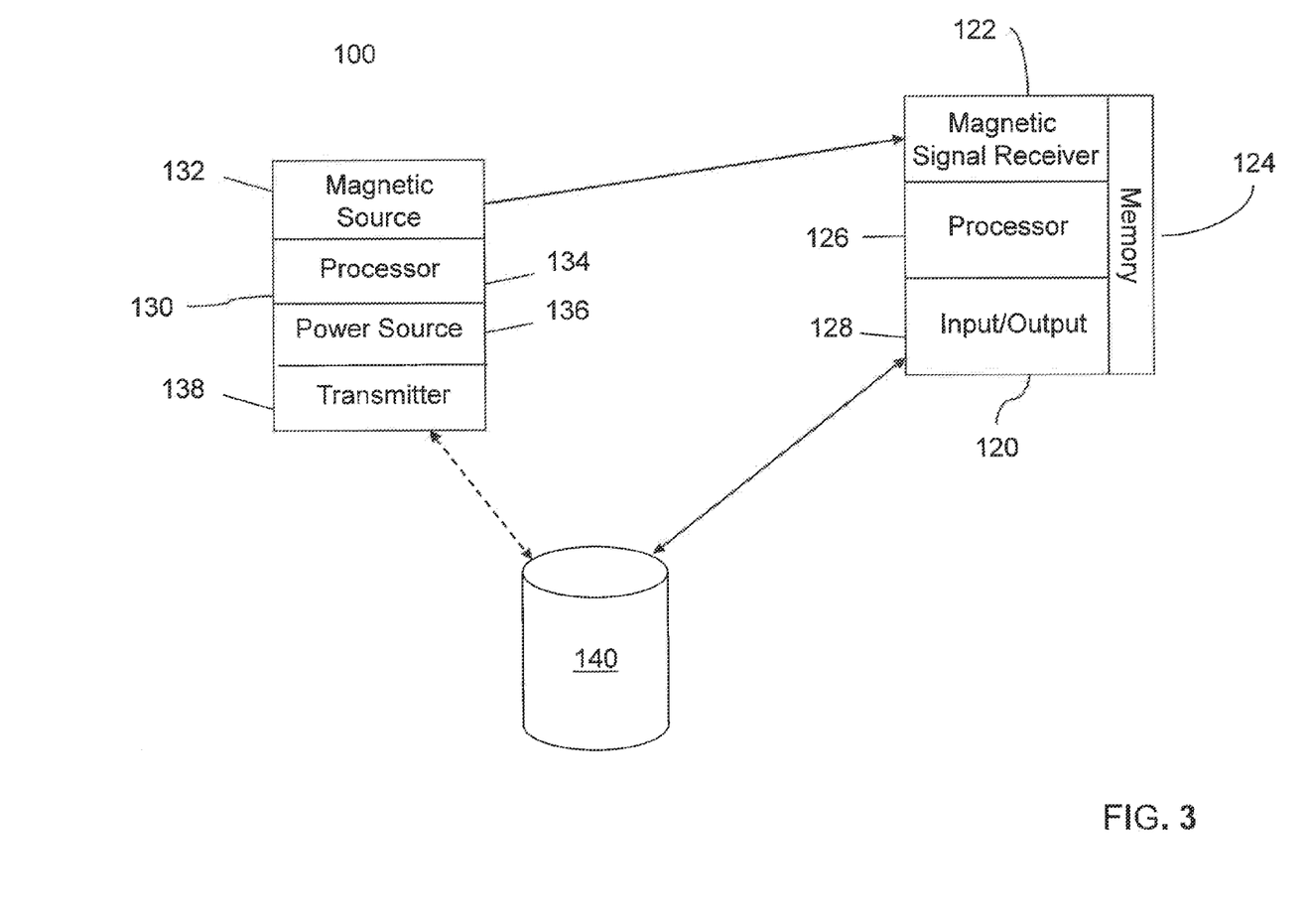
FIG. 3 is a diagram of an embodiment of an exemplary system for the determination of a mobile device position including a mobile device, a reference server, and a deployed magnetic signal source.

With reference to FIG. 3, signal source 130 can include a magnetic source 132 for generating the magnetic signal, a processor 134, a power source 136, and a transmitter 138. Signal source 130 can be adapted to transmit a signal at a low frequency such that the signals may propagate through structures (e.g., walls) with little or no change and may be accurately received at mobile device 120, in an embodiment, signal source 130 transmits a magnetic signal in the range of from about 20 kHz to about 100 kHz, for example, about 60 kHz. In one embodiment, the magnetic signal may be in the range of less than about 30 kHz. In some embodiments, the signal frequency is above the audible frequency range. In some embodiments, the signal frequency is such that it does not interfere with radio communications. The signal may be unique to the area proximate the signal source such that a mobile device may be adapted to recognize the signal and ignore other signals that may be in the area. In one embodiment, one or more signal characteristics, including, but not limited to, the frequency of the signal are unique to the area and may be used to identify the signal source 130. Other transmitted characteristics may serve as the unique identifier of the signal, including, but not limited to, direct sequence, frequency hopping, frequency sweeps and chirps, and other forms of spectrum modulation and combinations thereof.

In an embodiment, magnetic source 132 includes a single magnetic source. In another embodiment, magnetic source 132 may include three orthogonal magnetic sources. Magnetic source 132 may generate a desired magnetic signal using known modulation methods. For example, magnetic source 132 may spin a magnet at a known rate which is unique to the area proximate the source, and which, in turn, generates a signal having a frequency unique to the area. In another example, magnetic source 132 may energize a coil with a controlled waveform to generate a desired time varying magnetic field. As will be appreciated by those of ordinary skill in the art, other manners of providing the desired unique magnetic signal may be used. The transmitter 138 may be configured to transmit the signal generated by the magnetic source 132, and the processor 136 may be configured control operation of the magnetic source and transmitter. For example, processor 136 may control the rotation of a magnet within magnetic source 132. In one embodiment, power source 136 may comprise a battery, or other suitable power source. In one embodiment, signal source 130 may be solar powered.

The structure and size of signal source 130 may vary depending on need, including spatial and aesthetic considerations. In one embodiment, signal source 130 may include a housing for containing the source components and the housing may be fixed to its location (e.g., a wall or ceiling).

Mobile device 120 can be adapted to receive the signal from signal source 130. With reference to FIG. 3, mobile device 120 may comprise any type of mobile communication or computing device having signal receiver 122 for receiving a signal transmitted with any one or more of the modulation methods described herein, one or more processors 126, a memory 124, a user input/output 128 (for example, QWERTY keyboard, touch-screen, microphone, or a T9 keyboard), and a communications infrastructure capable of receiving and transmitting data over a network. Software may include one or more applications and an operating system. Hardware can include, but is not limited to, a processor, memory, and graphical user interface display. For example, mobile device 120 can include, but is not limited to, a mobile phone, a personal digital assistant (PDA), a laptop computer, a tablet computer, a notebook computer, an e-reader, or other similar type of mobile device capable of processing instructions and receiving and transmitting data.

Mobile device 120 is broadly defined to include any type of device that can be mobile with the ability to communicate. For example, mobile communication device 120 can include devices such as a robot, a vehicle, or any other type of mobile device with communication capabilities.

In another embodiment, a non-mobile device (not shown) may communicate with signal source 130. Such a non-mobile device can include devices such as an asset that is desired to be tracked, or a rarely moved item, e.g., a copying machine.

In some embodiments, signal receiver 122 comprises one or more magnetic sensors 122 for receiving the magnetic signal from signal source 130. Magnetic sensors 122 can be low power and small in size. For example, magnetic sensors 122 may be about 1 mm^3 to about 4 mm^3. In an embodiment with multiple magnetic sensors 122, a tri-axial magnetometer may be used.

The indoor positioning system 100 may include reference server 140 in communication with mobile device 120 and/or signal source 130. In one embodiment, reference server 140 is located remote from signal source 130. In another embodiment, reference server 140 is located proximate to signal source 130 within interior space 105. In one embodiment, reference server 140 may be stored within a memory of signal source 130 or mobile device 120. As will be appreciated by persons skilled in the relevant art, reference server 140 may comprise a single processing device or multiple processing devices, such as, for example, a server farm.

In some embodiments, stored on reference server 140 is information relating to signal source 130 that may be accessed by mobile device 120. For example, reference server 140 may include a unique identifier, such as, for example, signal or transmitted characteristics described above, that may be used to identify a signal source 130 proximate the mobile device 120.

In some embodiments, reference server 140 can be configured to set a transmission parameter, for example, frequency, modulation, or any other parameter, of signal source 130.

In an embodiment, mobile device 120 is configured to determine a reference location that may be used to determine its position relative to signal source 130 and/or its absolute position within interior space 105. For example, mobile device 120 may determine a reference location based on the coordinates of the last GPS signal received at the device, the location of the last base station (e.g., cell tower) that communicated with the device, the position shown on a map recently displayed or accessed by the device, or the location of a wireless access point, an internet protocol address, or any other device used for internet or computer geolocation. In an embodiment, mobile device 120 may provide reference location information to reference server 140 to obtain a unique identifier of a proximate signal source 130. Based on this signal source information, mobile device 120 recognizes a particular signal to receive and may ignore other signals that may be in the area.

The bearing and strength of the signal received by the mobile device 120 may be used to determine the position and orientation of the mobile device relative to the signal source 130. Based on the determination of the position of the mobile device relative to the signal source 130, and the known position of the source, the absolute position and orientation of the mobile device may then be determined.

In one embodiment, signal source 130 may transmit additional information to mobile device 120 within the interior space 105. The additional information may be embedded as metadata within the magnetic signal, or otherwise transmitted to mobile device 120. For example, additional information may be transmitted by signal source 130 at a low data rate (e.g., 100 bits/sec). The information may include information related to objects of interest 150, 152 and 154, or doorway 160 which may be proximate signal source 130. The information may include location, detail features, history, in-depth description, sales price, an internet address for a webpage with relevant information, an identification number associated with the signal source, a frequency of a nearby signal source, a status (for example, an emergency status) for the location, instructions for the user, or any other possible associated information. In some embodiments, reference server 140 communicates the additional information to signal source 130.

In an embodiment, signal source 130 may transmit information relating to the position or a unique identifying characteristic of another proximate signal source to thereby facilitate user navigation within interior space 105. For example, as a user 110 is proceeding within a building, after determining its position using a first signal source 130, user 110 may navigate to a second signal source based on information about that source provided by the first signal source 130.

Figure 4:
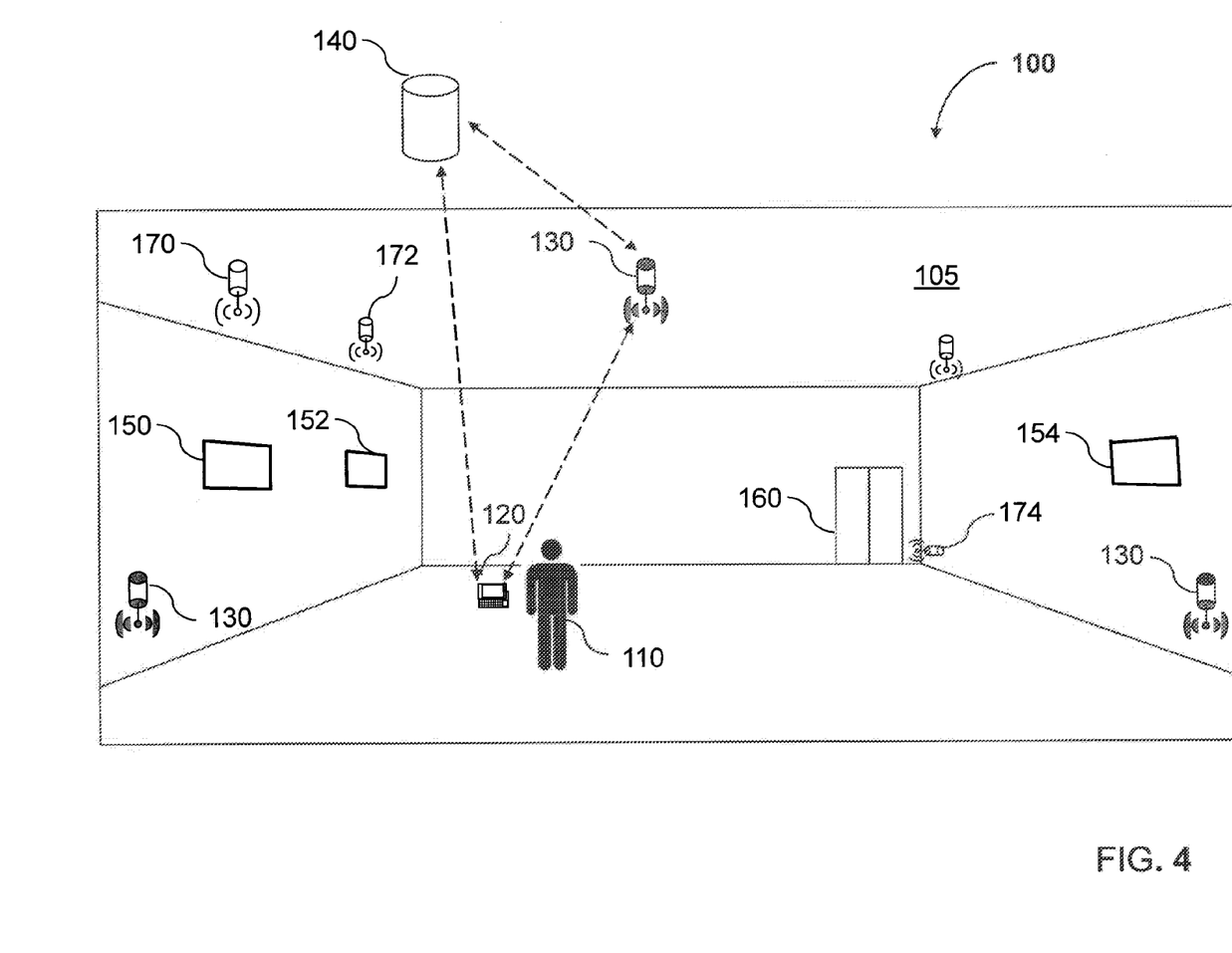
FIG. 4 is a diagram of an exemplary placement of multiple indoor signal sources and information beacons according to an embodiment of the present invention.

In another embodiment, with reference to FIG. 4, the system 100 may include one or more information beacon tags 170, 172, and 174 to transmit information within interior space 105. For example, user 110 could be viewing object of interest 150 that is located in proximity to signal source 130, and may be interested in additional information concerning object of interest 150. In an embodiment, by using mobile communication device 120, the user can receive additional information concerning object of interest 150 that is transmitted from the beacon tag.

II. Method

Figure 5:
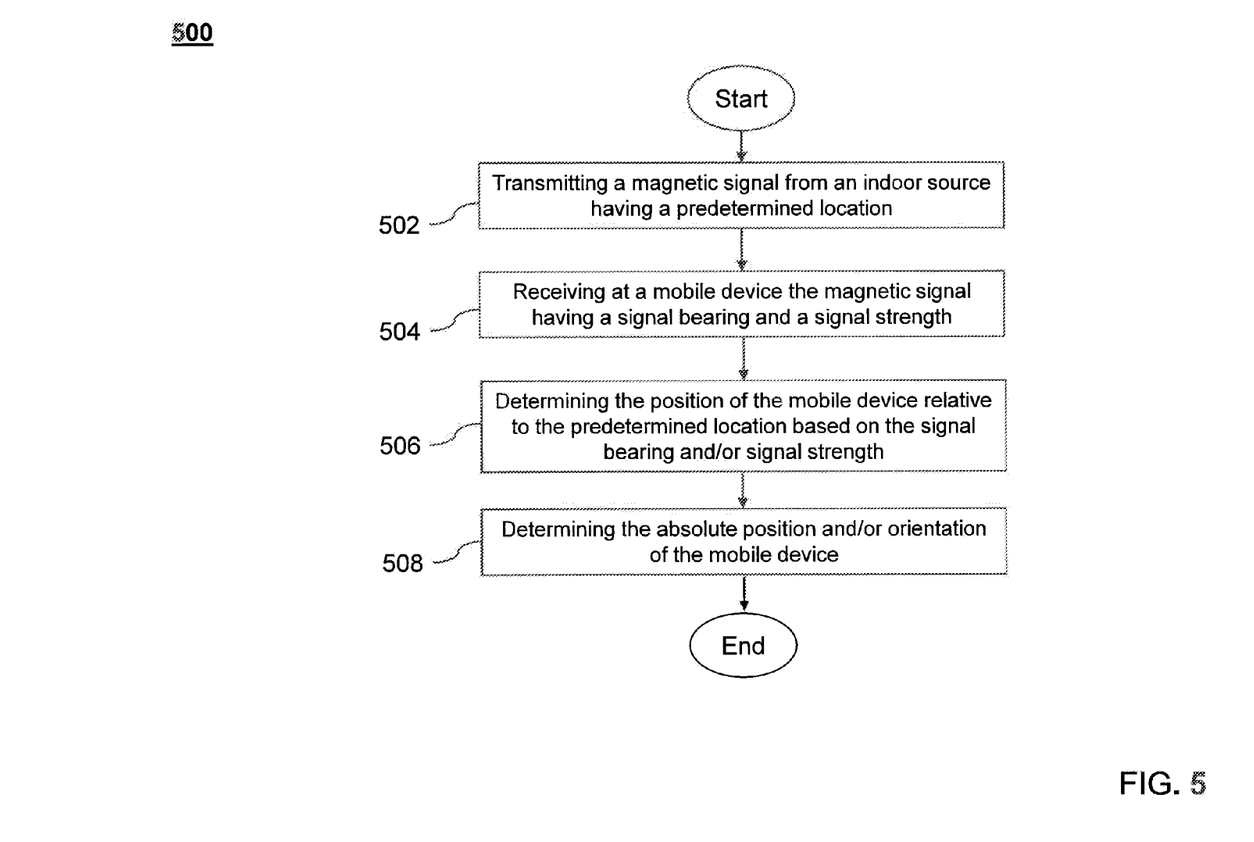
FIG. 5 is a process flowchart of a method including determining a position of a mobile device according to an embodiment of the present invention.

FIG. 5 is a process flowchart of an exemplary method 500 for determining a position of a mobile device according to an embodiment of the present invention. Method 500 includes at least steps 502, 504, 506, and 508. For ease of explanation, system 100 of FIGS. 1-3, as described above, will be used to describe method 500, but are not intended to be limited thereto.

Method 500 begins in step 502, where the process starts by transmitting a magnetic signal from an indoor source having a predetermined location. For example, FIGS. 1 and 2 illustrate an exemplary placement of one or more magnetic signal sources 130 within an interior space 105. The number and placement of signal sources is exemplary only. Exact placement of each source may be dependent upon the application in which the devices are intended to be used. Each signal source 130 may be configured to provide a signal with transmission characteristics unique to the location of the source, e.g., a unique magnetic frequency.

Method 500 then proceeds to step 502, which includes receiving at a mobile device the magnetic signal having a signal bearing and strength. For example, a mobile device 120 having a magnetic signal receiver 122 may receive the magnetic signal and be configured to determine the signal strength and its bearing (e.g., in a tri-axial arrangement).

Method 500 then proceeds to step 506, which includes determining the position of the mobile device relative to the predetermined location of the signal source based on the signal strength and/or the signal bearing. In step 508, the method includes determining the absolute position and/or orientation of the mobile device. The device absolute position and/or orientation may be determined using the known position of the signal source 130 and the calculated position of the device relative to the source.

Figure 6:
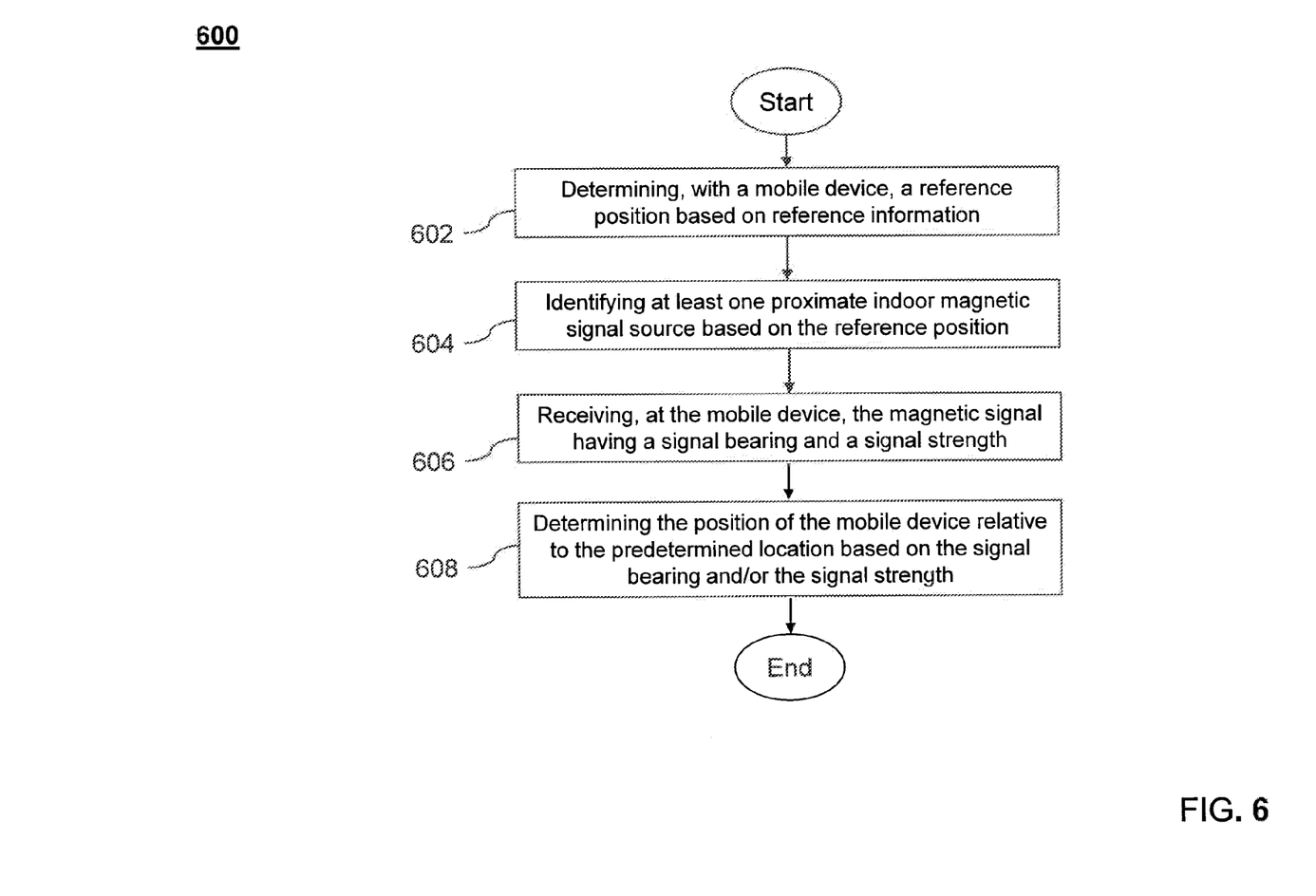
FIG. 6 is a process flowchart of a method including determining a position of a mobile device based on signal bearing and signal strength according to an embodiment of the present invention.

FIG. 6 is a process flowchart of an exemplary method 600 for determining a position of a mobile device according to an embodiment of the present invention. Method 600 includes at least steps 602, 604, 606, and 608. For ease of explanation, system 100 of FIGS. 1-3, as described above, will be used to describe method 600, but are not intended to be limited thereto.

Method 600 may begin with step 602, which includes determining with a mobile device a reference location based on reference information. For example, mobile device 120 may determine a reference location based on the coordinates of the last GPS signal received at the device, the location of the last base station that communicated with the device, or the position shown on a map recently displayed or accessed by the device.

Method 600 may then proceed to step 604, which includes identifying at least one proximate indoor magnetic signal source based on the reference location. For example, the mobile device 120 may provide the determined reference location to a reference server 140 over a communications network. Based on the reference location, the reference server 140 may determine unique information relating to a signal source that is proximate to the reference location. For example, the signal source information may include a unique transmission characteristic relevant to the proximate signal source 130. The signal source information may be stored on the reference server 140, and the reference server 140 may communicate the signal source information to the mobile device 130, for example, over a communications network. Based on the signal source information, the mobile device 120 recognizes a particular signal to receive and may ignore other signals that may be in the area.

In some embodiments, reference server 140 may determine that there are no nearby signal sources 130 and communicate this absence to mobile device 120. In such embodiments, mobile device 120 may then not search for a signal, which can conserve energy and processing resources.

In step 606, the method includes the step of receiving at the mobile device the magnetic signal having a signal bearing and strength. For example, the mobile device 120 having a magnetic signal receiver 122 may receive the magnetic signal and be configured to determine the signal strength and its bearing (e.g., in a tri-axial arrangement).

Method 600 then proceeds to step 608, which includes determining the position of the mobile device relative to the predetermined location of the signal source based on the signal strength and/or the signal bearing. The device absolute position and/or orientation then may be determined using the known position of the signal source 130 and the calculated position of the device relative to the source.

Figure 7:
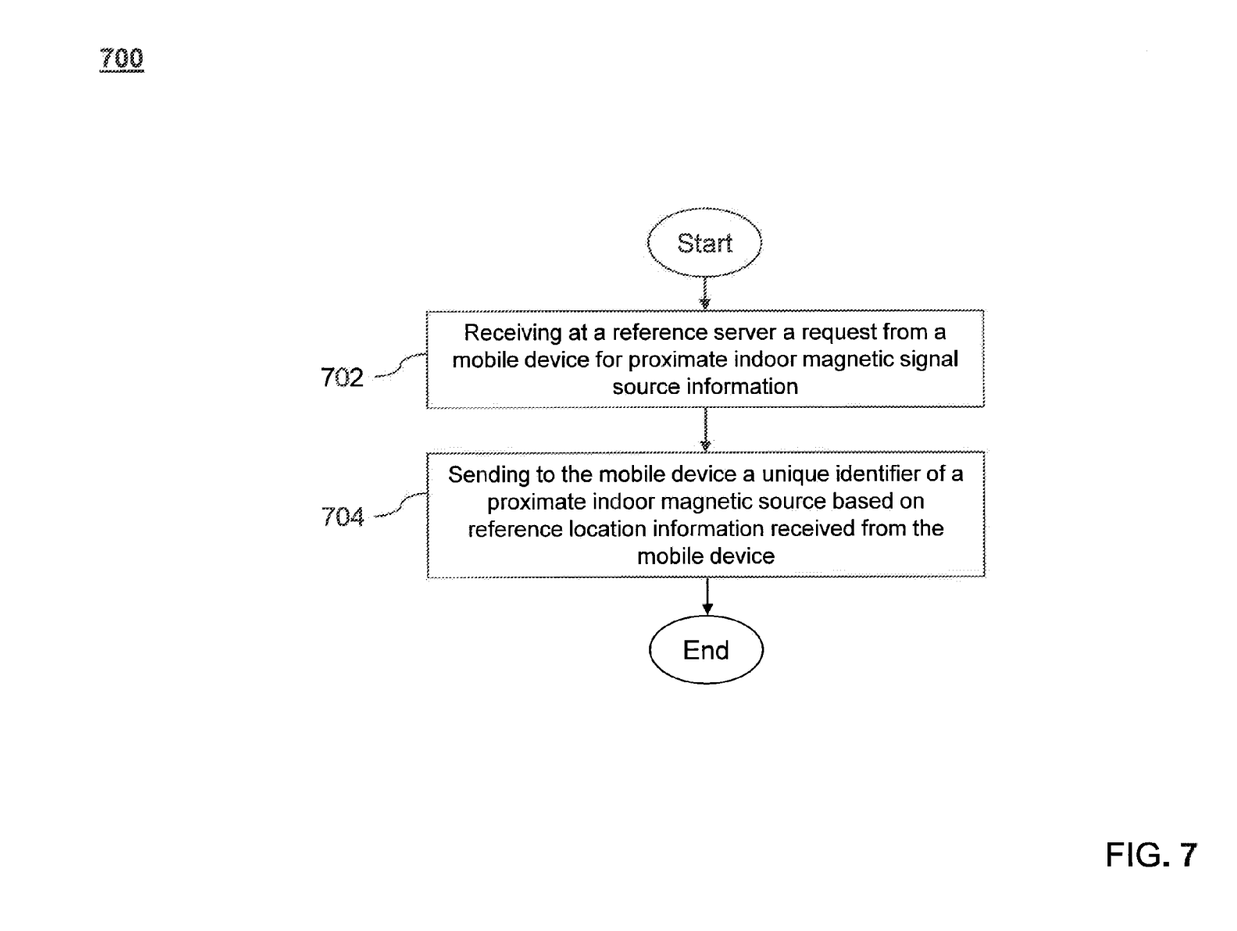
FIG. 7 is a process flowchart of a method including receiving a request from a mobile device and sending indoor magnetic source information according to an embodiment of the present invention.

FIG. 7 is a process flowchart of an exemplary method 700 for determining a position of a mobile device according to an embodiment of the present invention. Method 700 includes at least steps 702 and 704. For ease of explanation, system 100 of FIGS. 1-3, as described above, will be used to describe method 700, but are not intended to be limited thereto.

Method 700 may begin with step 702, which includes receiving at a reference server a request from a mobile device for proximate indoor magnetic signal source information. For example, mobile device 120 may determine a reference location and the request to reference server 140 may include the reference location. Alternatively, reference server 140 may determine a reference location of mobile device 140 simply from receiving a signal from the mobile device.

Method 700 may then proceed to step 704, which includes sending to the mobile device a unique identifier of a proximate indoor magnetic source based on reference location information received from the mobile device. Based on the reference location, reference server 140 may determine unique information relating to a signal source that is proximate to the reference location. The signal source information may include a unique transmission characteristic relevant to the proximate signal source 130. For example, the unique information may include a signal modulation parameter. The signal source information may be stored on the reference server 140, and the reference server 140 may communicate the signal source information to the mobile device 130, for example, over a communications network. Based on the signal source information, the mobile device 120 recognizes a particular signal to receive and may ignore other signals that may be in the area.

III. Example Computer System Implementation

Aspects of the above described systems and methods shown in FIGS. 1-7, or any part(s) or function(s) thereof, may be implemented using hardware, software modules, firmware, tangible computer readable media having instructions stored thereon, or a combination thereof and may be implemented in one or more computer systems or other processing systems.

Figure 8:
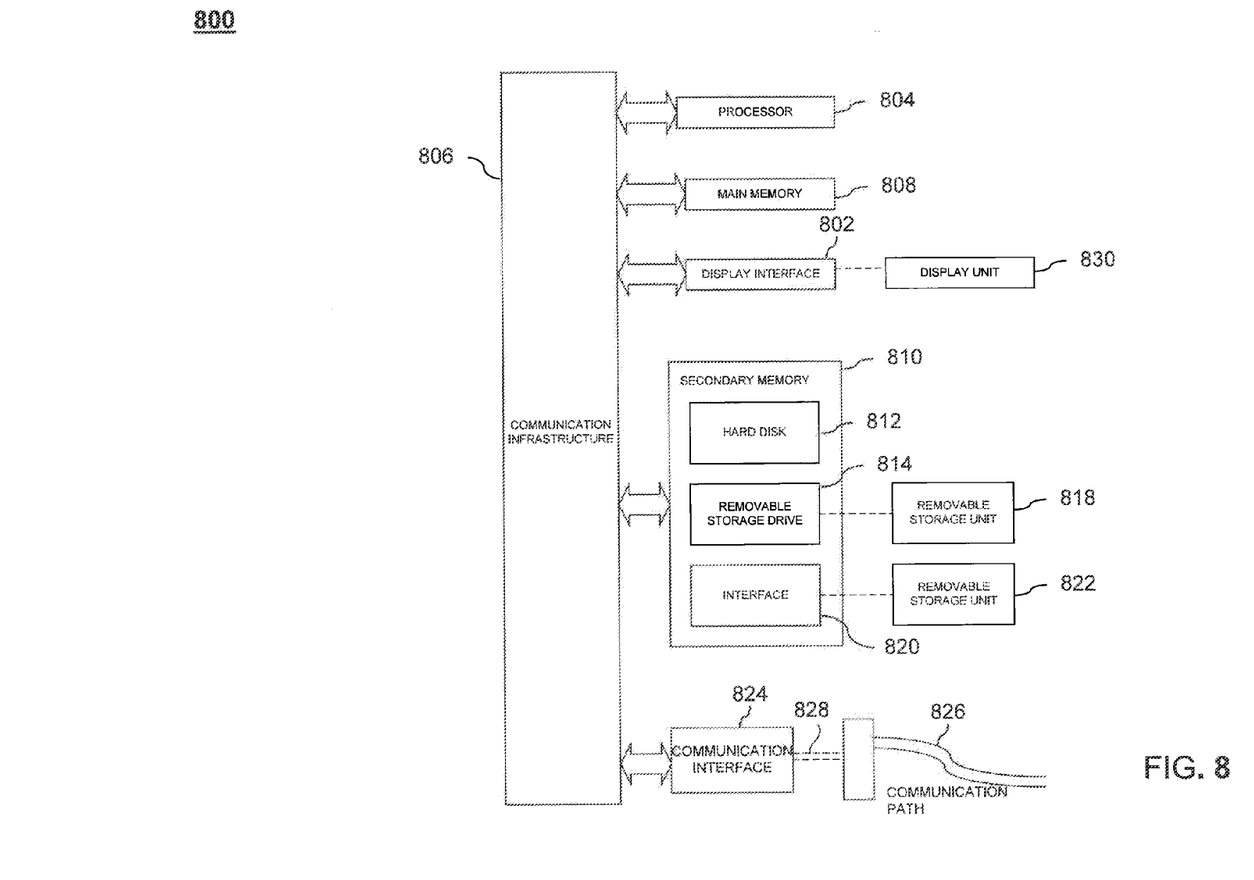
FIG. 8 is a diagram of an example computer system in which embodiments can be implemented.

FIG. 8 illustrates an example computer system 800 in which embodiments, or portions thereof, may by implemented as computer-readable code. For example, portions of system 100, e.g., mobile communication device 120, portions of reference server 140, and/or portions of signal source 130, may be implemented in computer system 800 using hardware, software, firmware, tangible computer readable media having instructions stored thereon, or a combination thereof and may be implemented in one or more computer systems or other processing systems. Hardware, software, or any combination of such may embody any of the modules and components and steps in FIGS. 1-7.

If programmable logic is used, such logic may execute on a commercially available processing platform or a special purpose device. One of ordinary skill in the art may appreciate that embodiments of the disclosed subject matter can be practiced with various computer system configurations, including multi-core multiprocessor systems, minicomputers, and mainframe computers, computer linked or clustered with distributed functions, as well as pervasive or miniature computers that may be embedded into virtually any device.

For instance, at least one processor device and a memory may be used to implement the above described embodiments. A processor device may be a single processor, a plurality of processors, or combinations thereof. Processor devices may have one or more processor "cores."

Various embodiments of the invention are described in terms of this example computer system 800. After reading this description, it will become apparent to a person skilled in the relevant art how to implement the invention using other computer systems and/or computer architectures. Although operations may be described as a sequential process, some of the operations may in fact be performed in parallel, concurrently, and/or in a distributed environment, and with program code stored locally or remotely for access by single or multi-processor machines. In addition, in some embodiments the order of operations may be rearranged without departing from the spirit of the disclosed subject matter.

Processor device 804 may be a special purpose or a general purpose processor device. As will be appreciated by persons skilled in the relevant art, processor device 804 may also be a single processor in a multi-core/multiprocessor system, such system operating alone, or in a cluster of computing devices operating in a cluster or server farm. Processor device 804 is connected to a communication infrastructure 806, for example, a bus, message queue, network, or multi-core message-passing scheme.

Computer system 800 also includes a main memory 808, for example, random access memory (RAM), and may also include a secondary memory 810. Secondary memory 810 may include, for example, a hard disk drive 812, removable storage drive 814. Removable storage drive 814 may include a floppy disk drive, a magnetic tape drive, an optical disk drive, a flash memory, or the like. The removable storage drive 814 reads from and/or writes to a removable storage unit 818 in a well known manner. Removable storage unit 818 may include a floppy disk, magnetic tape, optical disk, etc. which is read by and written to by removable storage drive 814. As will be appreciated by persons skilled in the relevant art, removable storage unit 818 includes a computer usable storage medium having stored therein computer software and/or data.

Computer system 800 (optionally) includes a display interface 802 (which can include input and output devices such as keyboards, mice, etc.) that forwards graphics, text, and other data from communication infrastructure 806 (or from a frame buffer not shown) for display on display unit 830.

In alternative implementations, secondary memory 810 may include other similar means for allowing computer programs or other instructions to be loaded into computer system 800. Such means may include, for example, a removable storage unit 822 and an interface 820. Examples of such means may include a program cartridge and cartridge interface (such as that found in video game devices), a removable memory chip (such as an EPROM, or PROM) and associated socket, and other removable storage units 822 and interfaces 820 which allow software and data to be transferred from the removable storage unit 822 to computer system 800.

Computer system 800 may also include a communication interface 824. Communication interface 824 allows software and data to be transferred between computer system 800 and external devices. Communication interface 824 may include a modem, a network interface (such as an Ethernet card), a communication port, a PCMCIA slot and card, or the like. Software and data transferred via communication interface 824 may be in the form of signals, which may be electronic, electromagnetic, optical, or other signals capable of being received by communication interface 824. These signals may be provided to communication interface 824 via a communication path 826. Communication path 826 carries signals and may be implemented using wire or cable, fiber optics, a phone line, a cellular phone link, an RF link or other communication channels.

In this document, the terms "computer program medium" and "computer usable medium" are used to generally refer to media such as removable storage unit 818, removable storage unit 822, and a hard disk installed in hard disk drive 812. Computer program medium and computer usable medium may also refer to memories, such as main memory 808 and secondary memory 810, which may be memory semiconductors (e.g. DRAMs, etc.).

Computer programs (also called computer control logic) are stored in main memory 808 and/or secondary memory 810. Computer programs may also be received via communication interface 824. Such computer programs, when executed, enable computer system 800 to implement the present invention as discussed herein. In particular, the computer programs, when executed, enable processor device 804 to implement the processes of the present invention, such as one or more of the steps in the methods illustrated by flowcharts 500, 600, and 700 discussed above. Accordingly, such computer programs represent controllers of the computer system 800. Where the invention is implemented using software, the software may be stored in a computer program product and loaded into computer system 800 using removable storage drive 814, interface 820, and hard disk drive 812, or communication interface 824.

Embodiments of the invention also may be directed to computer program products comprising software stored on any computer useable medium. Such software, when executed in one or more data processing device, causes a data processing device(s) to operate as described herein. Embodiments of the invention employ any computer useable or readable medium. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, and optical storage devices, MEMS, nanotechnological storage device, etc.).

IV. Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method for determining position, comprising:
  receiving, at a mobile device, a magnetic signal having a signal bearing and a signal strength, the signal being transmitted from a magnetic signal source having a predetermined location in an interior space, the signal having a frequency unique to the predetermined location such that the frequency of the signal can be used to identify the magnetic signal source; and
  determining, by the mobile device, a position of the mobile device relative to the predetermined location in the interior space based on the signal bearing and signal strength;
  wherein the magnetic signal is transmitted by energizing an electromagnetic coil with a controlled waveform to generate a time varying magnetic field having a frequency corresponding to the frequency unique to the predetermined location.

2. The method of claim 1, further comprising determining an absolute position of the mobile device.

3. The method of claim 1, wherein the magnetic signal comprises a low frequency modulated magnetic signal.

4. The method of claim 3, wherein the magnetic signal has a frequency less than approximately 100 kHz.

5. The method of claim 3, wherein the signal comprises a unique modulation parameter.

6. The method of claim 1, wherein determining the absolute position of the mobile device includes determining an absolute orientation of the mobile device.

7. A method for determining position, comprising:
  receiving, at a mobile device, a magnetic signal, wherein the magnetic signal includes a signal bearing and a signal strength, wherein the signal is transmitted from a magnetic signal source deployed at an indoor predetermined location, the signal having a frequency unique to the indoor predetermined location such that the frequency of the signal can be used to identify the magnetic signal source; and
  determining, by the mobile device, an absolute position and an absolute orientation of the mobile device within an interior space;
  wherein the magnetic signal is transmitted by energizing an electromagnetic coil with a controlled waveform to generate a time varying magnetic field having a frequency corresponding to the frequency unique to the predetermined location.

8. The method of claim 7, wherein the magnetic signal comprises a low frequency modulated magnetic signal.

9. A system for determining position, comprising:
  a mobile device comprising a receiver configured to receive a low-frequency magnetic signal transmitted from a magnetic signal source deployed at a predetermined location within an interior space, the signal having a frequency being unique to the predetermined location such that the frequency of the signal can be used to identify the magnetic signal source; and
  a processor adapted to determine a position within an interior space of the mobile
  device relative to the predetermined location based on a signal bearing and a signal strength of the magnetic signal
  wherein the magnetic signal is transmitted by energizing an electromagnetic coil with a controlled waveform to generate a time varying magnetic field having a frequency corresponding to the frequency unique to the predetermined location.

10. The system of claim 9, further comprising the indoor magnetic signal source for transmitting the low-frequency magnetic signal.

11. The system of claim 9, wherein the magnetic signal has a frequency less than approximately 100 kHz.

12. The system of claim 9, wherein the processor is adapted to determine an absolute position and an absolute orientation of the mobile device.

* * * * *